(12) United States Patent
Oda et al.

(10) Patent No.: US 11,064,619 B2
(45) Date of Patent: Jul. 13, 2021

(54) ELECTRICAL JUNCTION BOX

(71) Applicant: Sumitomo Wiring Systems, Ltd., Mie (JP)

(72) Inventors: Maiko Oda, Mie (JP); Kensaku Nishii, Mie (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 16/599,509

(22) Filed: Oct. 11, 2019

(65) Prior Publication Data
US 2020/0120817 A1  Apr. 16, 2020

(30) Foreign Application Priority Data

Oct. 12, 2018  (JP) .............................. JP2018-193801

(51) Int. Cl.
*H01R 12/00* (2006.01)
*H05K 5/00* (2006.01)
*H01R 13/405* (2006.01)
*H01R 12/58* (2011.01)

(52) U.S. Cl.
CPC ......... *H05K 5/0069* (2013.01); *H05K 5/0047* (2013.01); *H01R 12/58* (2013.01); *H01R 13/405* (2013.01)

(58) Field of Classification Search
CPC .... H01R 12/58; H01R 13/405; H05K 5/0069; H05K 5/0047
USPC ........................................ 439/76.1, 76.2, 910
See application file for complete search history.

(56) References Cited

U.S. PATENT DOCUMENTS

| 7,101,230 B2 * | 9/2006 | Ma ........................ H01R 12/57 |
| | | 439/668 |
| 7,591,669 B1 * | 9/2009 | Peng ..................... H01R 12/716 |
| | | 439/489 |
| 9,637,072 B2 * | 5/2017 | Aoki ................... B60R 16/0238 |
| 2016/0295714 A1 | 10/2016 | Taniguchi et al. |

\* cited by examiner

*Primary Examiner* — Khiem M Nguyen
(74) *Attorney, Agent, or Firm* — Honigman LLP

(57) ABSTRACT

Provided is an electrical junction box that enables easily checking the connection state of a connector terminal and a substrate. The electrical junction box includes: a box body; a substrate that is fitted to an inner portion of the box body; a connector terminal that passes through a side wall of the box body and is held thereby, and includes an inward end portion that is connected to the substrate; and a window hole that is formed in the side wall and enables visually checking a portion where the connector terminal is connected to the substrate.

2 Claims, 5 Drawing Sheets

US 11,064,619 B2

ELECTRICAL JUNCTION BOX

CROSS-REFERENCE TO RELATED APPLICATIONS

This application claims priority of Japanese Patent Application No. JP 2018-193801 filed on Oct. 12, 2018, the contents of which are incorporated herein.

TECHNICAL FIELD

The present disclosure relates to an electrical junction box.

BACKGROUND

Vehicles have electrical junction boxes installed therein (for example, JP 2016-189674A) that are used to connect in-vehicle loads such as lamps, wipers, and motors to in-vehicle power sources. An electrical junction box according to JP 2016-189674A includes an upper case (closing body) that holds a substrate (circuit board) therein, and a lower case (housing body) that is configured to be fitted to the upper case. A connector is provided on an external surface of the upper case.

The connector includes a connector terminal (bus bar) of which one end portion protrudes from an external surface of the upper case, and a frame-shaped portion (hood portion) that protrudes from the external surface and surrounds the periphery of the one end portion of the connector terminal. The connector terminal and the upper case are formed as a single body through insert molding. The other end portion of the connector terminal is soldered to a through hole that is provided in the substrate.

However, after the substrate and the upper case have been fitted to each other, the connection state of the connector terminal and the substrate can be easily checked from the lower case side before the lower case has been fitted to the upper case, but the connection state is not easily checked from the opposite side when the connector terminal and the upper case are integrated. Accordingly, there is concern that detection will not be possible if the connection state of the connector terminal and the substrate is poor.

SUMMARY

An object of the present disclosure is to provide an electrical junction box that enables easily checking the connection state of a connector terminal and a substrate.

An electrical junction box according to a mode of the present disclosure includes: a box body; a substrate that is fitted to an inner portion of the box body; a connector terminal that passes through a side wall of the box body and is held thereby, and includes an inward end portion that is connected to the substrate; and a window hole that is formed in the side wall and enables visually checking a portion where the connector terminal is connected to the substrate.

With the configuration described above, the connection state of the terminal and the substrate can be easily checked.

DETAILED DESCRIPTION OF PREFERRED EMBODIMENTS

The following is a description of an embodiment of the present disclosure. Also, at least parts of the embodiment described below may be freely combined.

An electrical junction box according to a mode of the present disclosure includes: a box body; a substrate that is fitted to an inner portion of the box body; a connector terminal that passes through a side wall of the box body and is held thereby, and includes an inward end portion that is connected to the substrate; and a window hole that is formed in the side wall and enables visually checking a portion where the connector terminal is connected to the substrate.

With this mode of the present disclosure, the portion of the connector terminal that connects to the substrate can be visually checked from the window hole. Accordingly, the connection state of the connector terminal and the substrate can be easily checked from outside the box body of the electrical junction box.

The electrical junction box according a mode of the present disclosure is an electrical junction box wherein the box body includes a first case that is configured to receive attachment of the substrate and to hold the connector terminal, and a second case that is configured to be fitted to the first case, the window hole is provided in the first case, and the second case includes a cover portion that is configured to cover the window hole when the second case is fitted to the first case.

With this mode of the present disclosure, the window hole is covered by the cover portion when the first case and the second case are fitted to each other, thus making it possible to prevent a foreign body from entering into the electrical junction box through the window hole.

The electrical junction box according to a mode of the present disclosure is an electrical junction box wherein the connector terminal and the first case are formed as a single body through insert molding.

With this mode of the present disclosure, the connector terminal and the first case can be treated as a single body.

An embodiment of the present disclosure will be specifically described below based on the drawings.

Figure 1:
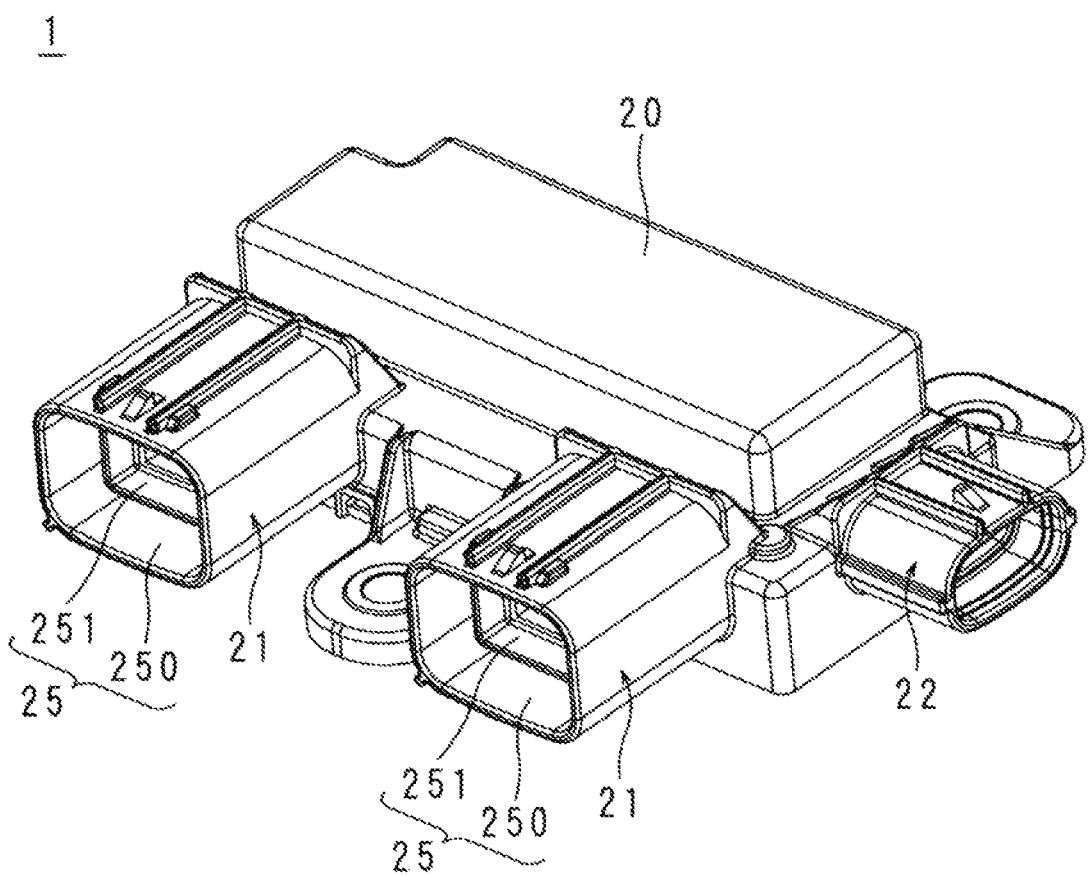
FIG. 1 is an external perspective view of an electrical junction box according to an embodiment.
Figure 2:
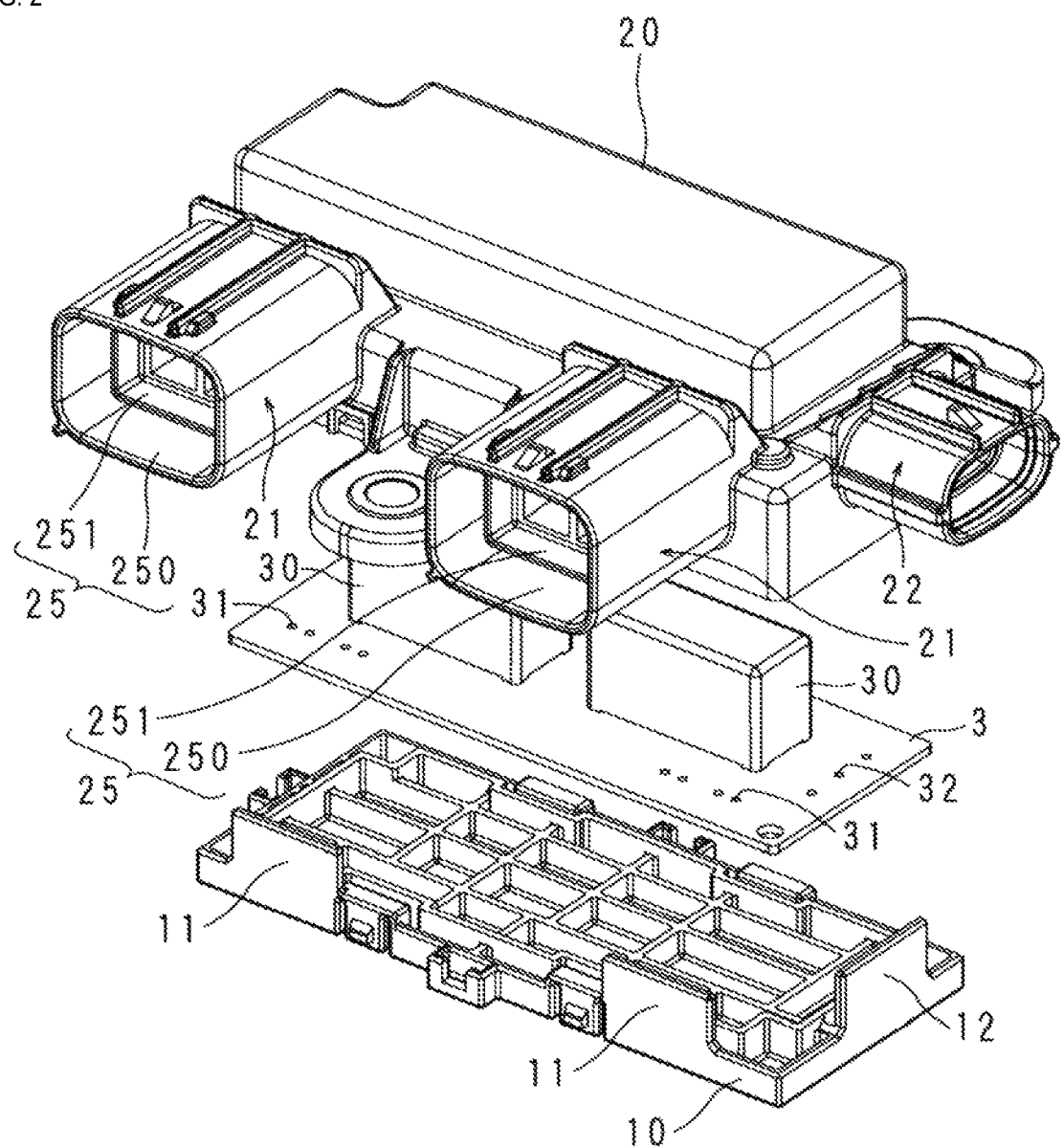
FIG. 2 is an exploded perspective view of the electrical junction box.
Figure 3:
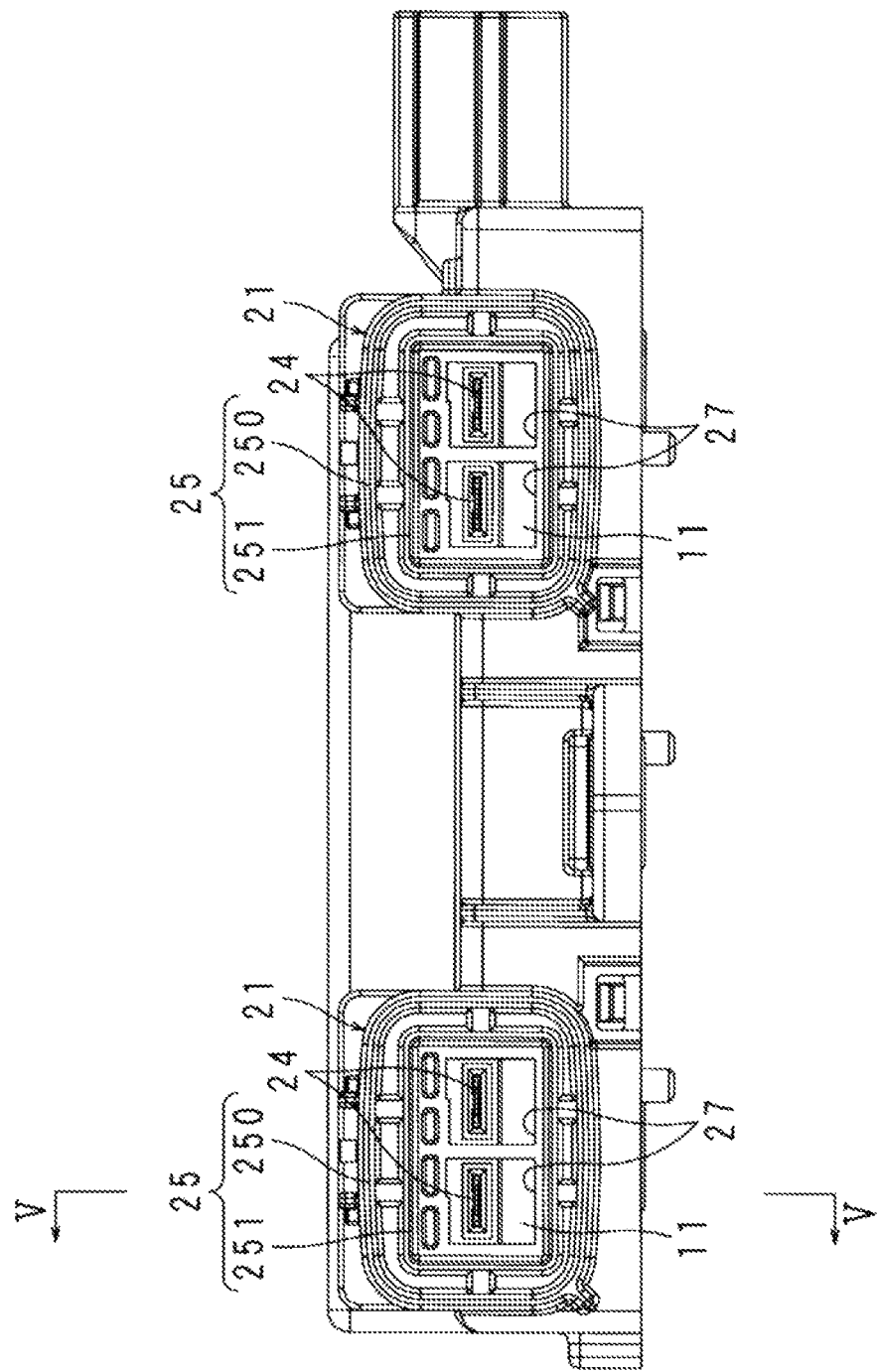
FIG. 3 is a front view of the electrical junction box.

FIG. 1 is an external perspective view of an electrical junction box according to the embodiment. FIG. 2 is an exploded perspective view of the electrical junction box. FIG. 3 is a front view of the electrical junction box. An electrical junction box 1 is used to connect an in-vehicle load such as a lamp, a wiper, or a motor to an in-vehicle power source. The electrical junction box 1 includes a lower case 10 and an upper case 20 that are rectangular box shaped and are each open on one side. The lower case 10 is configured to be fitted to the upper case 20 from the open side thereof.

The electrical junction box 1 may be installed in a vehicle such that, for example, the upper case 20 is on the upper side. Note that the electrical junction box 1 is not limited to a mode in which the upper case 20 is on the upper side, and may also be installed such that, for example, the upper case 20 is positioned diagonally or sideways, in accordance with the vehicle design or the like.

Both end portions of one side wall of the lower case 10 in the lengthwise direction thereof are each provided with an extending plate portion 11 that extends upward. A middle portion of one side wall of the lower case 10 in the widthwise direction thereof is provided with an extending plate portion 12 that extends upwards.

One side wall of the upper case 20 in the lengthwise direction thereof has two connectors 21 provided parallel to each other. Also, one side wall on the upper case 20 in the widthwise direction thereof is provided with one connector 22.

Also, a rectangular substrate 3 is housed inside the upper case 20, and one surface of the substrate 3 is provided with electrical components such as relays 30. The one surface of the substrate 3 faces the upper case 20, and the other surface of the substrate 3 faces the lower case 10.

The connectors 21 and the connector 22 each have a similar construction, and therefore the following description will be given with the connector 21 as an example. The connector 21 includes two connector terminals 24 and a frame-shaped portion 25.

The frame-shaped portion 25 protrudes substantially perpendicularly from a side wall of the upper case 20. The frame-shaped portion 25 includes an outer tube 250 and an inner tube 251. The outer tube 250 and the inner tube 251 have rectangular cross-sections and are provided on the same axis. Liquid such as water is prevented from entering inward of the inner tube 251 by a waterproofing rubber member or the like that is included on an external connector of a wire or the like that is configured to be connected to the connector 21.

Figure 4:
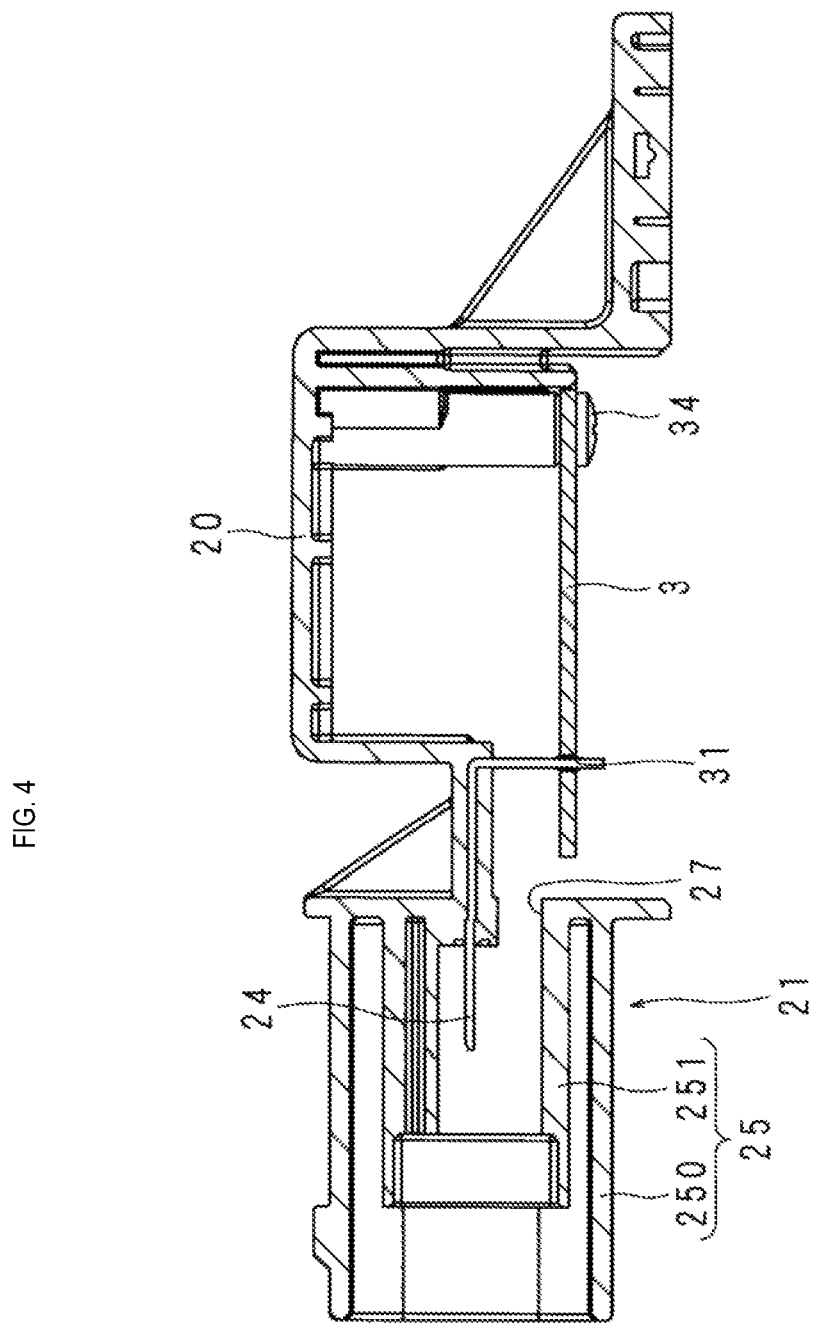
FIG. 4 is a sectional view showing a connector terminal soldered to a substrate.
Figure 5:
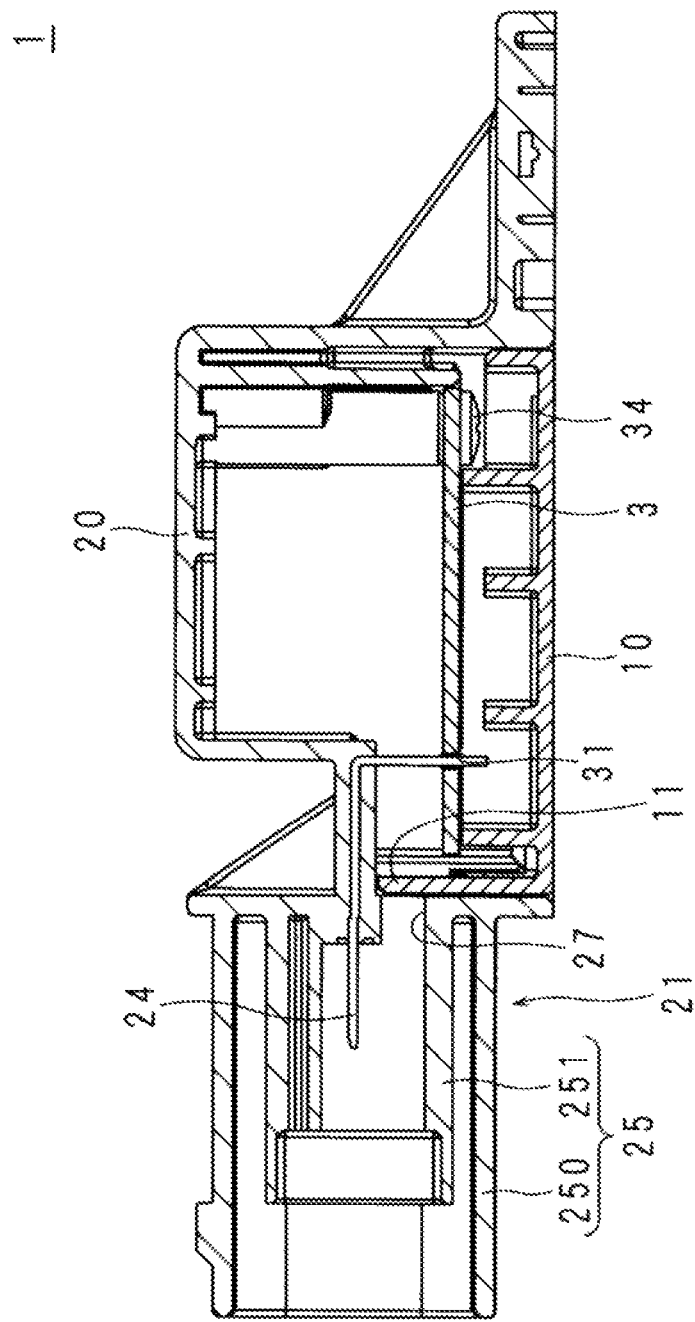
FIG. 5 is a sectional view of the electrical junction box taken along a line V-V in FIG. 3.

FIG. 4 is a sectional view showing the connector terminal 24 soldered to the substrate 3. FIG. 5 is a sectional view of the electrical junction box 1 taken along a line V-V in FIG. 3. The connector terminal 24 is formed from a conductive member. The connector terminal 24 has a shape that resembles the letter "L" when viewed from one side thereof, and one end portion of the connector terminal 24 protrudes substantially perpendicularly from the side wall of the upper case 20 into the inner tube 251. Also, the connector terminal 24 and the upper case 20 are formed as a single body through insert molding, and the middle portion of the connector terminal 24 that includes the corner portion thereof is held by the upper case 20. The other end portion of the connector terminal 24 is connected to the substrate 3.

As shown in FIG. 2, a plurality of through holes 31 are provided in both end portions of one of the long-side portions of the substrate 3. Also, a plurality of through holes 32 are provided along one of the short-side area portions of the substrate 3. The other end portion of the connector terminal 24 is inserted into the through hole 31 of the substrate 3 and soldered thereto. Here, the other end portion of the connector terminal 24 may also branch into two ends so as to match the number of through holes. The substrate 3 is fixed to the upper case 20 with use of a screw 34.

Also, a window hole 27 is provided in the side wall of the upper case 20 at a position inwards of the inner tube 251 and is in communication with the inner space of the upper case 20. The window hole 27 is arranged at a position that is lower than the connector terminal 24. It is possible to visually check the inside of the upper case 20 from the outside thereof, from the connector 21 via the window hole 27.

The lower case 10, the upper case 20, and the substrate 3 are arranged such that the one long-side area portion and one short-side area portion of each one correspond to those of the other ones, and are fitted to each other. The upper case 20 is fitted over the lower case 10 so as to cover the whole periphery thereof.

After the upper case 20 and the connector terminal 24 are formed through insert molding and the other end of the connector terminal 24 is soldered to the through hole 31, but before the lower case 10 is fitted to the upper case 20, as shown in FIG. 4, the connection state of the connector terminal 24 and the substrate 3 during the soldering of the connector terminal 24 to the through hole 31 can be visually checked from one surface side of the substrate 3 via the window hole 27. Also, the connection state of the connector terminal 24 and the substrate 3 during the soldering of the connector terminal 24 to the through hole 31 can be checked from the other surface side of the substrate 3 before the lower case 10 is fitted to the upper case 20.

When the lower case 10 and the upper case 20 are fitted to each other, as shown in FIGS. 3 and 5, the extending plate portion 11 of the lower case 10 comes into contact with the underside of the upper case 20 and covers the window hole 27. Also, the extending plate portion 12 of the lower case 10 covers a window hole (not shown) that is provided in the connector 22.

With the configuration described above, it is possible to visually check the inside of the upper case 20 from the outside thereof via the window hole 27 that is arranged at a position that is inward of the inner tube 251 of the connector 21, and therefore the connection state of the connector terminal 24 and the substrate 3 can be easily checked, during the soldering of the connector terminal 24 to the through hole 31. Also, it is possible to cover the window hole 27 with the extending plate portion 11 by fitting the upper case 20 and the lower case 10 to each other. Thus, it is possible to prevent a foreign body from entering through the window hole 27. Furthermore, the connector terminal 24 and upper case 20 are formed through insert molding and can therefore be treated as a single body, thus making the fitting of the electrical junction box 1 easy.

Note that, in the periphery of the window hole 27, a cut-out may be provided in the side wall or the like of the inner tube 251 such that light is allowed to enter via the window hole 27. Thus, it is possible to more favorably visually check the inside of the electrical junction box 1 from the outside thereof.

The embodiments disclosed in this application are to be considered in all respects as illustrative and not restrictive. The scope of the present disclosure is indicated by the scope of the claims rather than by the meaning of the above description, and all changes that come within the meaning and range of equivalency of the claims are intended to be embraced therein.

What is claimed is:

1. An electrical junction box comprising:
    a box body having a first case that is configured to receive attachment of a substrate and to hold a connector terminal, and a second case that is configured to be fitted to the first case;
    a substrate that is fitted to an inner portion of the box body;
    a connector terminal that passes through a side wall of the first case of the box body and is held thereby, and includes an inward end portion that is connected to the substrate;
    a window hole provided in the first case and is formed in the side wall and enables visually checking a portion where the connector terminal is connected to the substrate; and
    wherein the second case includes a cover portion that is configured to cover the window hole when the second case is fitted to the first case.

2. The electrical junction box according to claim 1, wherein the connector terminal and the first case are formed as a single body through insert molding.

\* \* \* \* \*